(12) United States Patent
Chen et al.

(10) Patent No.: US 11,239,113 B2
(45) Date of Patent: Feb. 1, 2022

(54) ARRAY SUBSTRATE AND PREPARATION METHOD THEREOF

(71) Applicants: Beijing BOE Optoelectronics Technology Co., Ltd., Beijing (CN); BOE Technology Group Co., Ltd., Beijing (CN)

(72) Inventors: Wei Chen, Beijing (CN); Zhiqiang Zhang, Beijing (CN); Hanqing Liu, Beijing (CN); Yangheng Li, Beijing (CN); Mingming Jia, Beijing (CN); Xin Li, Beijing (CN); Yong Song, Beijing (CN)

(73) Assignees: Beijing BOE Optoelectronics Technology Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 51 days.

(21) Appl. No.: 16/836,308

(22) Filed: Mar. 31, 2020

(65) Prior Publication Data
US 2021/0143057 A1    May 13, 2021

(30) Foreign Application Priority Data
Nov. 12, 2019    (CN) .......................... 201911101525.3

(51) Int. Cl.
*H01L 21/76*    (2006.01)
*H01L 21/768*    (2006.01)

(52) U.S. Cl.
CPC .. *H01L 21/76877* (2013.01); *H01L 21/76802* (2013.01)

(58) Field of Classification Search
CPC .................... H01L 21/76877; H01L 21/76802
See application file for complete search history.

(56) References Cited

U.S. PATENT DOCUMENTS

| 2002/0113239 | A1  | 8/2002  | Uochi et al. |
| 2009/0120501 | A1* | 5/2009  | Engle ................ H01J 37/32009 |
|              |     |         | 136/264 |
| 2011/0297930 | A1  | 12/2011 | Choi et al. |
| 2016/0254287 | A1  | 9/2016  | Wang et al. |
| 2016/0358937 | A1  | 12/2016 | Qu |
| 2017/0162369 | A1* | 6/2017  | Kang ................ H01J 37/32862 |

FOREIGN PATENT DOCUMENTS

| CN | 102270644 A | 12/2011 |
| CN | 104218094 A | 12/2014 |
| CN | 104465510 A | 3/2015 |
| CN | 105097839 A | 11/2015 |

OTHER PUBLICATIONS

Office Action for corresponding Chinese application No. 201911101525.3 dated Aug. 17, 2021.

* cited by examiner

*Primary Examiner* — Bradley Smith
(74) *Attorney, Agent, or Firm* — Arent Fox LLP; Michael Fainberg

(57) ABSTRACT

The present disclosure discloses an array substrate and a preparation method thereof. After a first passivation layer is formed, residual gas is directly drawn out of a closed chamber to prevent the residual gas from reacting to form an unstable layer on the first passivation layer. Furthermore, after the residual gas is drawn out, a preset gas fills the closed chamber, and is retained for a preset time period and then drawn out. The retaining of the preset gas can effectively alleviate the damage to the passivation layer by static electricity.

8 Claims, 6 Drawing Sheets

ARRAY SUBSTRATE AND PREPARATION METHOD THEREOF

This application claims priority to Chinese Patent Application No. 201911101525.3, filed on Nov. 12, 2019, which is hereby incorporated by reference in its entirety.

FIELD

The present disclosure relates to the field of display, in particular to an array substrate and a preparation method thereof.

BACKGROUND

An array substrate in the related art includes: a base substrate, a plurality of thin-film transistors positioned on the base substrate for controlling corresponding pixels to display, and a passivation layer and an electrode layer positioned on the sides, facing away from the base substrate, of the thin-film transistors, where the electrode layer is electrically connected with a source-drain electrode layer of the thin-film transistors by through holes formed in the passivation layer.

In the preparation process of the array substrate, a mixed gas fills a closed chamber and reacts, and reactants are deposited on the base substrate to form the passivation layer. After the formation of the passivation layer with a preset thickness, in order to prevent static electricity generated in the closed chamber from affecting the formed passivation layer, the residual gas after reaction needs to be retained for a time period and be released in stages. However, in the process of retaining the residual gas, an unstable layer would be formed on the passivation layer, as both the concentration of the residual gas and the pressure of the closed chamber are insufficient, the hardness of the formed unstable layer is much greater than that of the passivation layer, so that sharp corners would appear in the process of etching via holes, the electrode layer formed on the unstable layer has the phenomenon of false disconnection at the sharp corners and is prone to corrosion, the normal transmission of signals is affected, and the display quality further declines.

Thus, how to prevent the appearance of the unstable layer in the process of forming the passivation layer is a technical problem which is urgent to be solved by those skilled in the art.

SUMMARY

In view of this, an embodiment of the present disclosure provides an array substrate and a preparation method thereof to avoid the appearance of an unstable layer in the process of forming a passivation layer.

In one aspect, an embodiment of the present disclosure provides a preparation method of an array substrate, the method includes: providing a base substrate; forming a first passivation layer on the base substrate in a closed chamber filled with a first reaction gas; drawing residual gas out of the closed chamber after the formation of the first passivation layer; and filling the closed chamber with a preset gas, retaining the preset gas for a first preset time period and drawing out the preset gas to complete the preparation of the first passivation layer, where the preset gas exists stably in the closed chamber.

In a possible implementation, in the preparation method of the array substrate provided by the embodiment of the present disclosure, the forming the first passivation layer on the base substrate in the closed chamber filled with the first reaction gas includes: placing the base substrate in the closed chamber; filling the closed chamber with the first reaction gas through a gas inlet of the closed chamber; and enabling the first reaction gas to react for a second preset time period in the closed chamber and enabling reaction products to gradually deposit on the base substrate to form the first passivation layer with a preset thickness.

In a possible implementation, in the preparation method of the array substrate provided by the embodiment of the present disclosure, the first reaction gas is a mixed gas containing silicon ions and nitrogen ions.

In a possible implementation, in the preparation method of the array substrate provided by the embodiment of the present disclosure, the first reaction gas is a mixed gas of $SiH_4$, $NH_3$ and $N_2$.

In a possible implementation, in the preparation method of the array substrate provided by the embodiment of the present disclosure, after the drawing the residual gas out of the closed chamber after the formation of the first passivation layer, the method further includes: cyclically executing the operation of filling the closed chamber with the preset gas, retaining the preset gas in the closed chamber for the first preset time period and drawing out the preset gas for many times.

In a possible implementation, in the preparation method of the array substrate provided by the embodiment of the present disclosure, before the formation of the first passivation layer, the method further includes: sequentially forming a third passivation layer and a second passivation layer on the base substrate in the closed chamber, where a hardness of the first passivation layer, the second passivation layer and the third passivation layer increases in sequence.

In a possible implementation, in the preparation method of the array substrate provided by the embodiment of the present disclosure, the sequentially forming the third passivation layer and the second passivation layer on the base substrate in the closed chamber includes: forming the third passivation layer in the closed chamber by adopting a second reaction gas; and forming the second passivation layer on the side, facing away from the base substrate, of the third passivation layer by adopting a third reaction gas; where, the second reaction gas and the third reaction gas have same components as the first reaction gas, and concentrations of the first reaction gas, the second reaction gas and the third reaction gas in the closed chamber decrease in sequence.

In a possible implementation, in the preparation method of the array substrate provided by the embodiment of the present disclosure, after the completion of the preparation of the first passivation layer, the method further includes: sequentially etching the first passivation layer, the second passivation layer and the third passivation layer at preset positions by adopting an etching process to form via holes with opening areas decreasing in sequence in a direction from the first passivation layer to the base substrate; and forming an electrode layer on a side, facing away from the base substrate, of the first passivation layer, where an orthographic projection of the electrode layer on the base substrate covers the via holes and the first passivation layer.

In a possible implementation, in the preparation method of the array substrate provided by the embodiment of the present disclosure, the electrode layer is an indium tin oxide transparent electrode layer.

In another aspect, an embodiment of the present disclosure further provides an array substrate which is formed by adopting the preparation method of the array substrate provided by any one of the above embodiments.

DETAILED DESCRIPTION OF THE EMBODIMENTS

Figure 1:
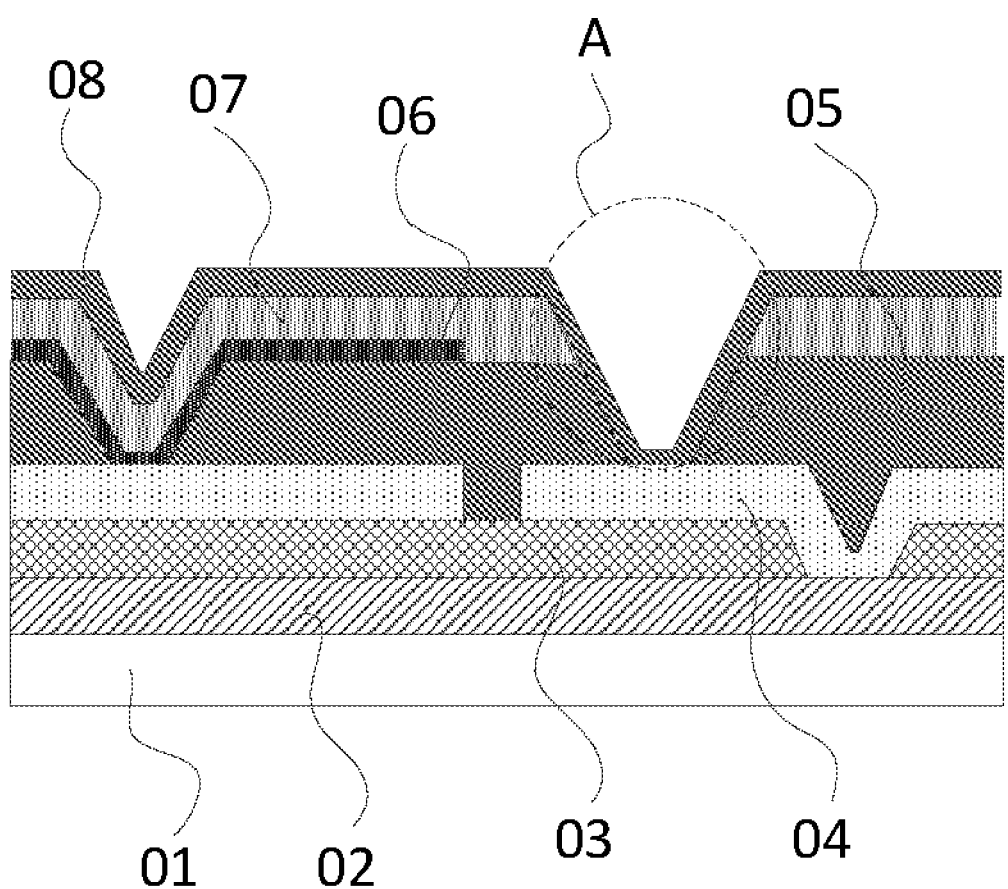
FIG. 1 is a schematic diagram of a section structure of an array substrate in the related art.

As shown in FIG. 1, an array substrate in the related art includes: a base substrate 01 and a gate layer 02, a gate insulation layer 03, a source-drain electrode layer 04, a planarization layer 05, a first electrode layer 06, a passivation layer 07 and a second electrode layer 08 which are located on the base substrate 01 in sequence. The first electrode 06 is connected to the source-drain electrode layer 04 through a via hole located in the planarization layer 05, and the second electrode layer 08 is connected to the source-drain electrode layer 04 through a via hole penetrating through the passivation layer 07 and the planarization layer 05.

Figure 2:
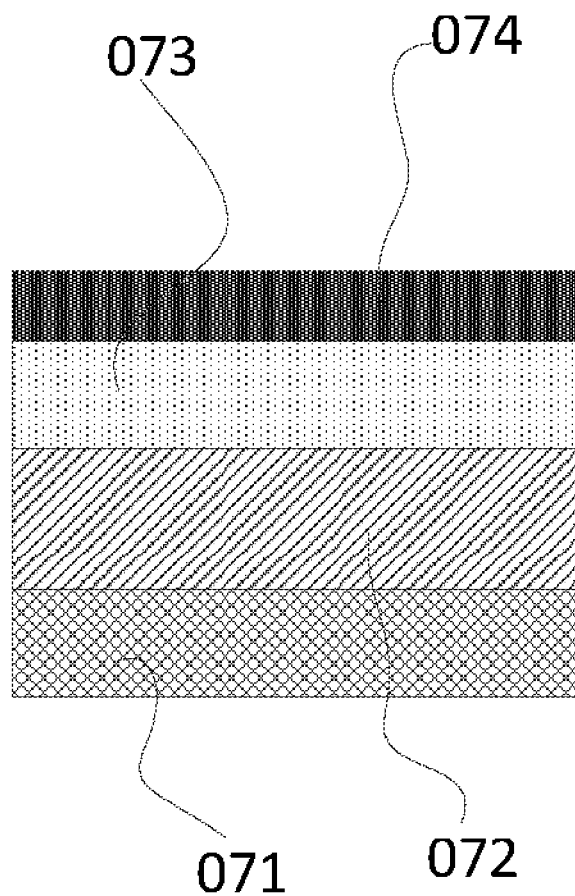
FIG. 2 is a schematic diagram of a section structure of a passivation layer of the array substrate in the related art.
Figure 3:
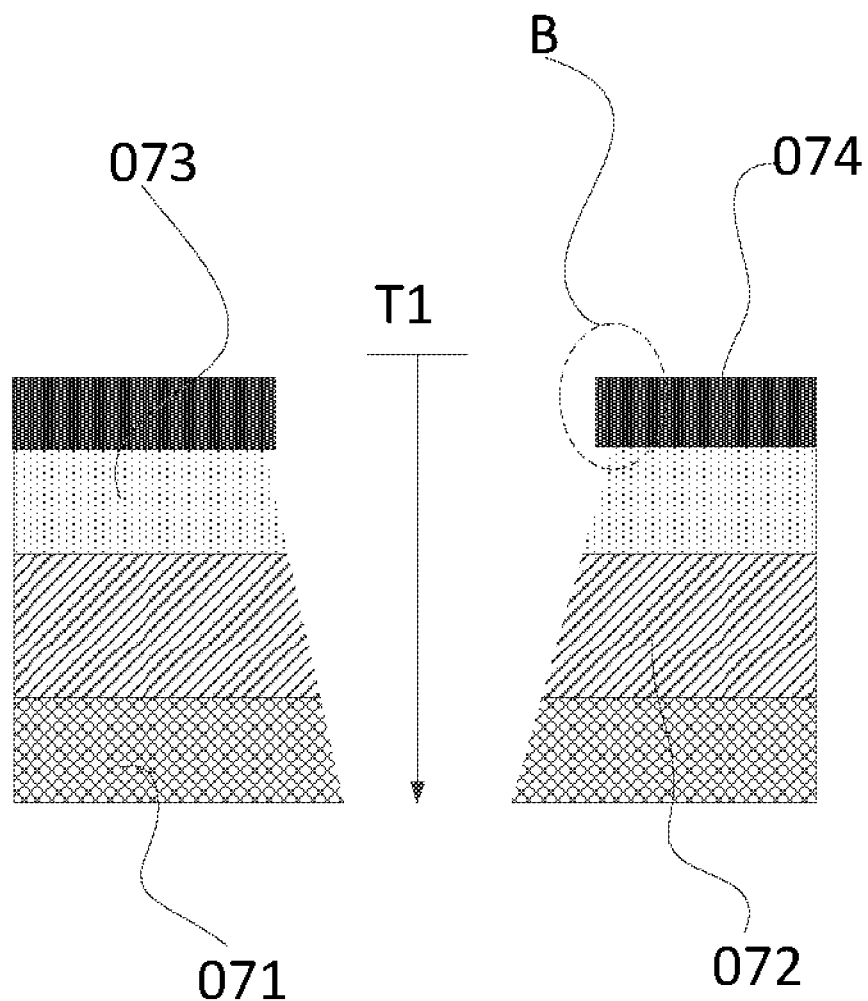
FIG. 3 is a schematic diagram of a section structure of the passivation layer, etched with via holes, in FIG. 2.

In the process of detecting the performance of the array substrate, it is found that the via hole (such as a region A in FIG. 1) where the second electrode 08 is connected to the source-drain electrode layer 04 is prone to corrosion, thereby causing the phenomenon of false disconnection of the second electrode 08. Through the check, it is found that the phenomenon of false disconnection is caused by sharp corners appearing in the process of forming the passivation layer 07. Specifically, the passivation layer 07 is formed by depositing reactants on the base substrate 01 in a closed chamber through the reaction of a mixed gas. As shown in FIG. 2, the specific structure of the passivation layer 07 includes: a bottom passivation layer 071, a middle passivation layer 072 and a top passivation layer 073, which are sequentially formed and located on a side, facing away from the base substrate 01, of the first electrode 06. However, after the formation of the top passivation layer 073, in order to prevent static electricity in the closed chamber from affecting the top passivation layer 073, residual gas needs to be retained for a time period after the reaction and then be released in stages. However, in the process of retaining the residual gas, an unstable layer 074 would be formed on the top passivation layer 073, as both the concentration of the residual gas and the pressure of the closed chamber are insufficient, the hardness of the formed unstable layer 074 is much greater than that of the top passivation layer 073. Furthermore, the thickness of the unstable layer 074 is about 2 nm. Thus, during etching of the via hole T1, the transverse etching rate of the unstable layer 074 is much less than the transverse etching rate of the top passivation layer 073, so that sharp corners (such as the region B in FIG. 3) would appear in the process of etching the via holes, then the electrode layer formed on the unstable layer 074 has the phenomenon of false disconnection at the sharp corners and is prone to corrosion, the normal transmission of signals is affected, and the display quality further declines.

In view of the foregoing problems in the process of preparing the array substrate in the related art, an embodiment of the present disclosure provides an array substrate and a preparation method thereof. In order to make the objects, technical solutions and advantages of the present disclosure clearer, specific implementations of an array substrate and a preparation method thereof according to an embodiment of the present disclosure will be described in detail below in conjunction with the accompanying drawings. It should be understood that the preferred embodiments described below are only used to illustrate and explain the present disclosure, and are not intended to limit the present disclosure. Moreover, in the case of no conflict, the embodiments in the present application and the features in the embodiments may be combined with each other.

Unless otherwise defined, the technical or scientific terms used in the present disclosure should have the ordinary meanings understood by those having ordinary skills in the field to which the present disclosure belongs. The terms "first", "second", and the like used in the present disclosure do not indicate any order, number or importance, but are only used to distinguish different components. The words "including" or "containing" and the like mean that the element or the item appearing before the word covers the elements or the items and the equivalents thereof listing after the word, without excluding other elements or the items. The words "connecting" or "connected" and the like are not limited to physical or mechanical connection, but may include electrical connection, no matter whether the connection is direct or indirect. "up", "down", "left", "right", and the like are only used to indicate the relative position relationship. When the absolute position of the described object changes, the relative position relationship may also change accordingly.

The shape and size of each component in the drawings do not reflect the true scale and are only used to illustrate the present disclosure.

Figure 4:
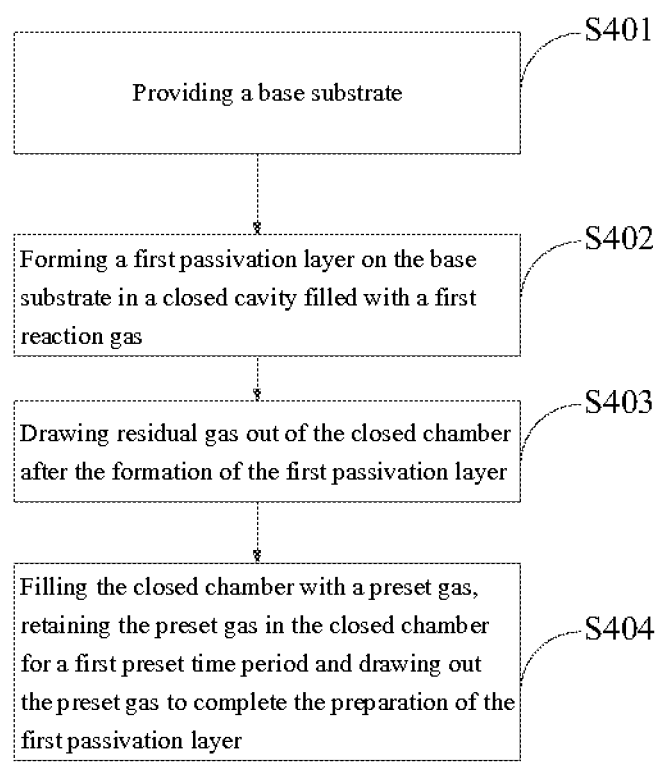
FIG. 4 is a flow diagram of a preparation method of an array substrate provided by an embodiment of the present disclosure.

In the preparation method of the array substrate provided by the embodiments of the present disclosure, as show in FIG. 4, the method includes the steps S401 to S404.

S401: providing a base substrate.

S402: forming a first passivation layer on the base substrate in a closed cavity filled with a first reaction gas.

S403: drawing residual gas out of the closed cavity after the formation of the first passivation layer.

S404: filling the closed chamber with a preset gas, retaining the preset gas for a first preset time period and drawing out the preset gas to complete the preparation of the first passivation layer, where the preset gas exists stably in the closed chamber.

An embodiment of the present disclosure provides a preparation method of an array substrate. After a first passivation layer is formed, residual gas is directly drawn out of a closed chamber to prevent the residual gas from reacting to form an unstable layer on the first passivation layer. Furthermore, after the residual gas is drawn out, a preset gas fills the closed chamber, and is retained for a preset time period and then drawn out. The retaining of the preset gas can effectively alleviate the damage to the passivation layer by static electricity. That is, the array substrate formed by the above preparation method can not only prevent the static electricity from damaging the passivation layer, but also avoid the formation of the unstable layer, and avoid the appearance of sharp corners during the etching process, thereby ensuring the uniform continuity of an electrode layer on the passivation layer, realizing effective transmission of signals and improving display quality.

It should be noted that, in the preparation method of the array substrate provided by the embodiment of the present disclosure, after the residual gas is drawn out of the closed chamber, the preset gas filling the closed chamber is the gas which may exist stably in the closed chamber, that is, the preset gas does not react in the closed cavity, so as to ensure the stability of the first passivation layer. In some embodiments, the preset gas filling the closed chamber may be hydrogen. Thus, the frequency of use of the hydrogen in the process of preparing the array substrate is relatively high. The gas source is easy to obtain. Of course, other preset gases meeting the above requirements may also be selected, which is not specifically limited herein.

Optionally, in the preparation method of the array substrate provided by the embodiment of the present disclosure, the forming the first passivation layer on the base substrate in the closed chamber filled with the reaction gas includes: placing the base substrate in the closed chamber; filling the closed chamber with the first reaction gas through a gas inlet of the closed chamber; and enabling the first reaction gas to react for a second preset time period in the closed chamber and enabling reaction products to gradually deposit on the base substrate to form the first passivation layer with a preset thickness.

Figure 5:
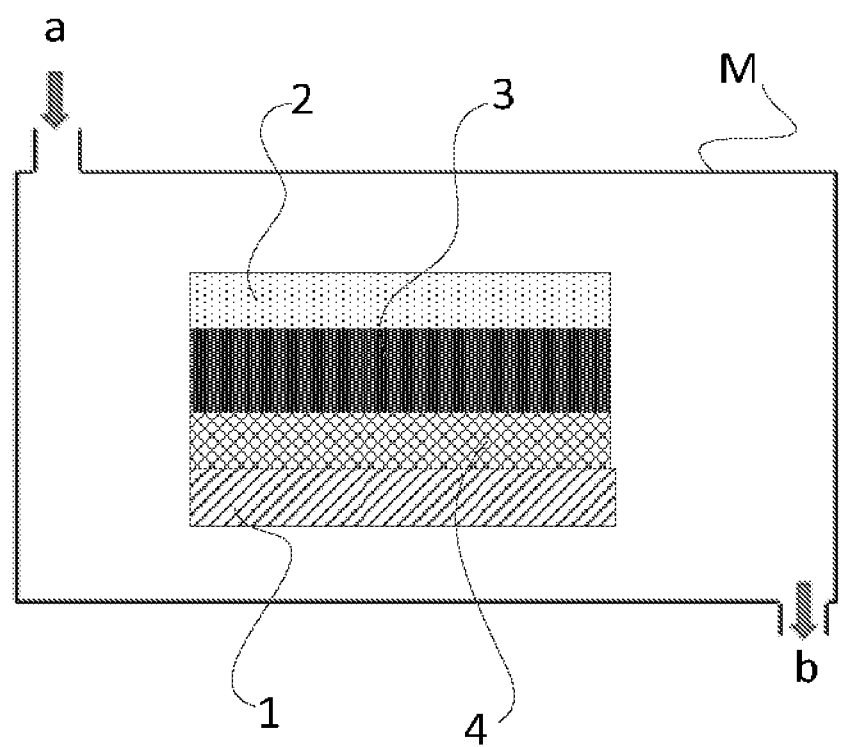
FIG. 5 is a structural schematic diagram of a passivation layer formed in a closed chamber provided by an embodiment of the present disclosure.
Figure 6:
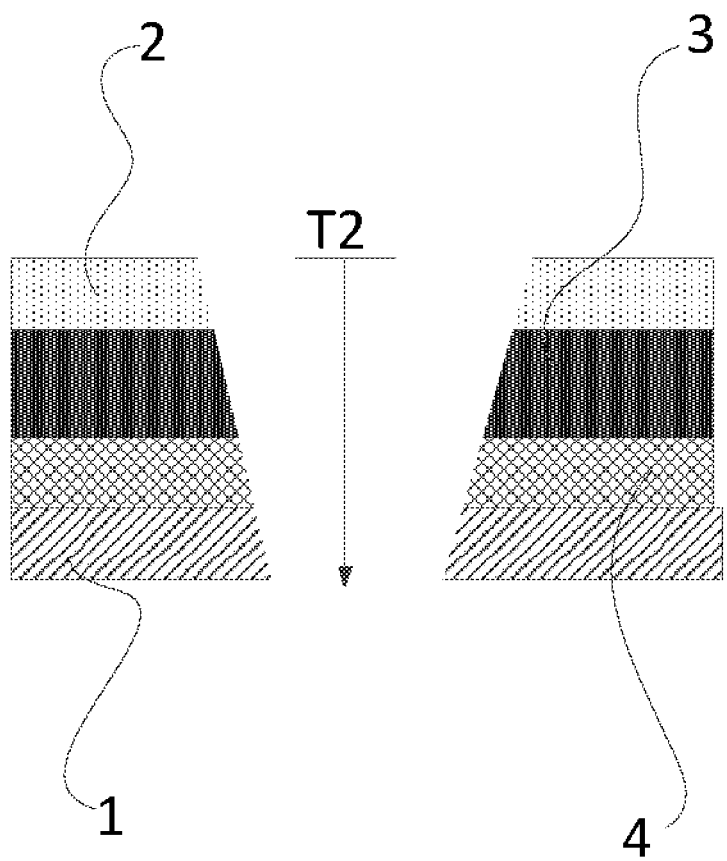
FIG. 6 is a schematic diagram of a section structure of the passivation layer, etched with via holes, provided by an embodiment of the present disclosure.

Specifically, in the preparation method of the array substrate provided by the embodiment of the present disclosure, as shown in FIG. 5, the preparation of the first passivation layer 2 is completed in the closed chamber. Specifically, the base substrate 1 is placed in the closed chamber M, then the first reaction gas is introduced into the closed chamber M through a gas inlet a, where the first reaction gas is a mixed gas, the mutually mixed gases react in the closed chamber M, reactants deposit on the base substrate 1 to form the first passivation layer 2, where the thickness of the first passivation layer 2 is preset, the reaction time of the first reaction gas in the closed chamber (that is, the duration of the second preset time period) is calculated according to the preset thickness of the first passivation layer 2. In general, the thickness of the first passivation layer 2 is about 20 nm. In order to form this thickness, the first reaction gas needs to be retained for 4 s-8 s in the closed chamber M, and the pressure in the closed chamber M is 1.83 T-1.87 T, where the concentration of the first reaction gas is the same as the concentration of the reaction gas adopted for preparing the first passivation layer 2 in the related art, which is not specifically limited herein.

Optionally, in the preparation method of the array substrate provided by the embodiment of the present disclosure, the first passivation layer is silicon nitride, so that the first reaction gas adopted should be a mixed gas containing silicon ions and nitrogen ions.

Specifically, in the preparation method of the array substrate provided by the embodiment of the present disclosure, the first reaction gas may be a mixed gas of $SiH_4$, $NH_3$ and $N_2$. Of course, the first reaction gas may also be other mixed gas containing the silicon ions and the nitrogen ions, which is not specifically limited herein.

Optionally, in the preparation method of the array substrate provided by the embodiment of the present disclosure, after the drawing the residual gas out of the closed chamber after the formation of the first passivation layer, the method includes: cyclically executing the operation of filling the closed chamber with the preset gas, retaining the preset gas for the first preset time period and then drawing out the preset gas for many times.

Specifically, in the preparation method of the array substrate provided by the embodiment of the present disclosure, as shown in FIG. 5, after the first passivation layer 2 with the preset thickness is formed, residual gas in the closed chamber M is immediately drawn out from a gas outlet b to prevent the generation of the unstable layer. In order to prevent the static electricity in the closed chamber M from damaging the first passivation layer 2, the preset gas fills the closed chamber M and is stably retained in the closed chamber M, thereby alleviating the influence of the static electricity on the first passivation layer 2. Specifically, the preset gas needs to be retained in the closed chamber M for about 30 s-1 min and then be drawn out.

In order to further reduce the influence of the static electricity on the first passivation layer, the above operations may be executed cyclically for many times, so as to reduce the damage to the passivation layer by the static electricity as much as possible. In the process of a specific implementation, the above operations may be executed cyclically for three times, in the process of cyclically executing the above operations for three times, the pressure formed by the preset gases filling in the closed chamber may be reduced in sequence, namely, the pressure formed by the preset gas filling at the first time in the closed chamber is greater than the pressure formed by the preset gas filling at the second time in the closed chamber, the pressure formed by the preset gas filling at the second time in the closed chamber is greater than the pressure formed by the preset gas filling at the third time in the closed chamber, so that the manufactured first passivation layer finally keeps stable under normal pressure. Where, the number of times of specific cyclical execution may be selected according to the actual situation, which is not specifically limited herein.

Optionally, in the preparation method of the array substrate provided by the embodiment of the present disclosure, before the formation of the first passivation layer, the method further includes: sequentially forming a third passivation layer and a second passivation layer on the base substrate in the closed chamber, where the hardness of the first passivation layer, the second passivation layer and the third passivation layer increases in sequence.

Specifically, in the preparation method of the array substrate provided by the embodiment of the present disclosure, in order to ensure the appearance of the via holes with large upper openings and small lower openings in the process of etching the via holes, the hardness of the parts of the passivation layers located on the base substrate needs to be different. In the process of a specific implementation, as shown in FIG. 5, a third passivation layer 4, a second passivation layer 3 and a first passivation layer 2 may be sequentially formed on the base substrate 1, so that the hardness of the third passivation layer 4 is greater than that of the second passivation layer 3, and the hardness of the second passivation layer 3 is greater than that of the first passivation layer 2. Thus, the transverse etching rate of the first passivation layer 2 away from the base substrate 1 is greater than the transverse etching rate of the third passivation layer 4 near to the base substrate 1 to form the appearance of the via hole T2 with the large upper opening and the small lower opening.

Optionally, in the preparation method of the array substrate provided by the embodiment of the present disclosure, the sequentially forming the third passivation layer and the second passivation layer on the base substrate in the closed chamber includes: forming the third passivation layer in the closed chamber by adopting the second reaction gas; and forming the second passivation layer on a side, facing away from the base substrate, of the third passivation layer by adopting a third reaction gas; where, the second reaction gas and the third reaction gas have the same components as the first reaction gas, and concentrations of the first reaction gas, the third reaction gas and the second reaction gas in the closed chamber decreases in sequence.

Specifically, in the preparation method of the array substrate provided by the embodiment of the present disclosure, both the third passivation layer and the second passivation layer are manufactured by filling the closed chamber with the mixed gas and depositing the reactants, so as to form the third passivation layer and the second passivation layer. Where, the third passivation layer, the second passivation layer and the first passivation layer may take silicon nitride as the material, so that the components of the reaction gas filling for manufacturing the three film layers may be the same. However, the thickness of the first passivation layer is 20 nm, the thickness of the second passivation layer is 400 nm, the thickness of the third passivation layer is 20 nm, and the hardness of the passivation layer needs to increase in sequence in the direction towards the base substrate. Thus, the concentration of gas filling the closed chamber, the pressure in the closed chamber and the retaining time in the process of forming the three passivation layers are different. Specifically, in the process of sequentially forming the third passivation layer, the second passivation layer and the first passivation layer, the content of the nitrogen ions and the silicon ions in the reaction gas filling increases in sequence, and the pressure decreases in sequence.

Optionally, in the preparation method of the array substrate provided by the embodiment of the present disclosure, after the completion of the manufacturing of the first passivation layer, the method further includes: sequentially etching the first passivation layer, the second passivation layer and the third passivation layer at preset positions by adopting an etching process to form via holes with the opening area decreasing in sequence in the direction from the first passivation layer to the base substrate; and forming an electrode layer on the side, facing away from the base substrate, of the first passivation layer, where the orthographic projection of the electrode layer on the base substrate covers the via holes and the first passivation layer.

Specifically, in the preparation method of the array substrate provided by the embodiment of the present disclosure, as the hardness of the first passivation layer, the second passivation layer and the third passivation layer which are sequentially formed on the base substrate increases in sequence, the appearance of the via holes with the large upper openings and the small lower openings may be formed by adopting the one-channel etching process, so as to ensure the continuous stability of the electrode layer which is formed subsequently at the via holes. Compared with the related art, as the unstable layer is not formed in the process of forming the passivation layers, the sharp corners would not appear in the etching process and the phenomenon of false disconnection can be avoided at the positions of top-end steps of the via holes of the electrode layer.

Optionally, in the preparation method of the array substrate provided by the embodiment of the present disclosure, the electrode layer is an indium tin oxide transparent electrode layer.

As the indium tin oxide transparent electrode layer is prone to false disconnection at the positions of the sharp corners in the forming process in the preparation method of the array substrate in the related art, by adopting the preparation method of the array substrate of the present disclosure, the unstable layer is not formed, the sharp corners are also avoided, and the connection stability of the electrode can be further improved.

Of course, other forms of the electrodes may also be adopted for improving the connection stability of the electrode as well, which may be selected specifically according to the actual using situation and is not specifically limited herein.

Based on the same inventive concept, an embodiment of the present disclosure further provides an array substrate which is formed by adopting the preparation method of the array substrate provided by any one of the above embodiments.

Thus, the array substrate has all the advantages of the preparation method of the array substrate provided by any one of the above embodiments, and the principle and the specific implementations are the same as those of the preparation method of the array substrate provided by any one of the above embodiments, which may be implemented by referring to the preparation method of the array substrate provided by any one of the above embodiments and will not be repeated here.

An embodiment of the present disclosure provides an array substrate and a preparation method thereof, and the preparation method of the array substrate includes: providing a base substrate; forming a first passivation layer on the base substrate in a closed chamber filled with a first reaction gas; drawing the residual gas out of the closed chamber after the formation of the first passivation layer; and filling the closed chamber with a preset gas, retaining the preset gas for a first preset time period and then drawing out the preset gas to complete the preparation of the first passivation layer, where the preset gas exists stably in the closed chamber. After the first passivation layer is formed, the residual gas is directly drawn out of the closed chamber to prevent the residual gas from reacting to form an unstable layer on the first passivation layer. Furthermore, after the residual gas is drawn out, a preset gas fills the closed chamber, and is retained for a preset time period and then drawn out. The retaining of the preset gas can effectively alleviate the damage to the passivation layer by static electricity. That is, the array substrate formed by the above preparation method can not only prevent the static electricity from damaging the passivation layer, but also avoid the formation of the unstable layer, and avoid the appearance of sharp corners during the etching process, thereby ensuring the uniform continuity of an electrode layer on the passivation layer, realizing effective transmission of signals and improving display quality.

Obviously, those skilled in the art may make various modifications and variations to the present disclosure without departing from the spirit and scope of the present disclosure. In this way, if these modifications and variations of the present disclosure fall within the scope of the claims and the equivalent technologies of the present disclosure, the present disclosure also intends to include these modification and variations.

The invention claimed is:

1. A preparation method of an array substrate, comprising:
providing a base substrate;
forming a first passivation layer on the base substrate in a closed chamber filled with a first reaction gas, wherein the first reaction gas is a mixed gas containing silicon ions and nitrogen ions;

drawing residual gas out of the closed chamber after the formation of the first passivation layer; and filling the closed chamber with a preset gas, retaining the preset gas in the closed chamber for a first preset time period and drawing out the preset gas to complete the preparation of the first passivation layer, wherein as compared with the residual gas, the preset gas exists more stably in the closed chamber;

wherein before the formation of the first passivation layer, the method further comprises:

sequentially forming a third passivation layer and a second passivation layer on the base substrate in the closed chamber, wherein a hardness of the first passivation layer, the second passivation layer and the third passivation layer increases in sequence.

2. The preparation method of the array substrate according to claim 1, wherein the forming the first passivation layer on the base substrate in the closed chamber filled with the first reaction gas comprises:

placing the base substrate in the closed chamber;

filling the closed chamber with the first reaction gas through a gas inlet of the closed chamber; and enabling the first reaction gas to react for a second preset time period in the closed chamber and enabling reaction products to gradually deposit on the base substrate to form the first passivation layer with a preset thickness.

3. The preparation method of the array substrate according to claim 1, wherein the first reaction gas is a mixed gas of $SiH_4$, $NH_3$ and $N_2$.

4. The preparation method of the array substrate according to claim 1, wherein after the drawing the residual gas out of the closed chamber after the formation of the first passivation layer, the method further comprises:

cyclically executing the operation of filling the closed chamber with the preset gas, retaining the preset gas in the closed chamber for the first preset time period and drawing out the preset gas for many times.

5. The preparation method of the array substrate according to claim 1, wherein the sequentially forming the third passivation layer and the second passivation layer on the base substrate in the closed chamber comprises:

forming the third passivation layer in the closed chamber by adopting a second reaction gas; and forming the second passivation layer on a side, facing away from the base substrate, of the third passivation layer by adopting a third reaction gas;

wherein, the second reaction gas and the third reaction gas have same components as the first reaction gas, and concentrations of the first reaction gas, the second reaction gas and the third reaction gas in the closed chamber decrease in sequence.

6. The preparation method of the array substrate according to claim 1, wherein after the completion of the preparation of the first passivation layer, the method further comprises:

sequentially etching the first passivation layer, the second passivation layer and the third passivation layer at preset positions by adopting an etching process to form via holes with opening areas decreasing in sequence in a direction from the first passivation layer to the base substrate; and forming an electrode layer on a side, facing away from the base substrate, of the first passivation layer, wherein an orthographic projection of the electrode layer on the base substrate covers the via holes and the first passivation layer.

7. The preparation method of the array substrate according to claim 6, wherein the electrode layer is an indium tin oxide transparent electrode layer.

8. An array substrate, wherein the array substrate is formed by adopting the preparation method of the array substrate according to claim 1.

* * * * *